US007606376B2

(12) United States Patent
Eid et al.

(10) Patent No.: US 7,606,376 B2
(45) Date of Patent: Oct. 20, 2009

(54) AUTOMOTIVE AUDIO CONTROLLER WITH VIBRATION SENSOR (75) Inventors: Bradley F. Eid, Greenwood, IN (US); David P. McCorkle, Carmel, IN (US); Ivan Gregory Dzombak, Pinckney, MI (US)

(73) Assignee: Harman International Industries, Incorporated, Northridge, CA (US)

( * ) Notice: Subject to any disclaimer, the term of this patent is extended or adjusted under 35 U.S.C. 154(b) by 769 days.

(21) Appl. No.: 10/703,826

(22) Filed: Nov. 7, 2003

(65) Prior Publication Data

US 2005/0100173 A1 May 12, 2005

(51) Int. Cl.
*H04B 1/00* (2006.01)
(52) U.S. Cl. .......................... 381/86; 381/57; 381/302; 381/104
(58) Field of Classification Search .................. 381/86, 381/56–57, 107, 104, 71.4, 71.1, 101–102, 381/94.7, 94.1, 302
See application file for complete search history.

(56) References Cited

U.S. PATENT DOCUMENTS

| | | | |
|---|---|---|---|
| 4,479,237 A * | 10/1984 | Sugasawa .................... 381/57 |
| 4,553,257 A | 11/1985 | Mori et al. |
| 4,558,460 A | 12/1985 | Tanaka et al. |
| 4,641,344 A | 2/1987 | Kasai et al. |
| 4,742,310 A | 5/1988 | Kato et al. |
| 4,864,246 A | 9/1989 | Kato et al. |
| 5,018,205 A | 5/1991 | Takagi et al. |
| 5,081,707 A | 1/1992 | Schorman et al. |
| 5,204,971 A | 4/1993 | Takahashi et al. |
| 5,317,305 A * | 5/1994 | Campman ................ 340/573.1 |
| 5,355,419 A * | 10/1994 | Yamamoto et al. ............ 381/86 |
| 5,426,703 A | 6/1995 | Hamabe et al. |
| 5,796,847 A | 8/1998 | Kaihotsu et al. .............. 381/57 |
| 5,872,852 A * | 2/1999 | Dougherty ................... 381/57 |

(Continued)

FOREIGN PATENT DOCUMENTS

DE 2225575 12/1973

(Continued)

OTHER PUBLICATIONS

European Search Report from corresponding European Application No. 04 02 2555, listing the above-referenced documents.

(Continued)

*Primary Examiner*—Vivian Chin
*Assistant Examiner*—Disler Paul
(74) *Attorney, Agent, or Firm*—Brinks Hofer Gilson & Lione (57) ABSTRACT An automotive audio controller is provided for receiving an audio signal from an audio source and providing a filtered audio signal that may help compensate for ambient noise in the automobile. The audio controller may have a vibration sensor that generates a vibration signal indicative of vibrations in the automobile. A dynamic filter of the audio controller may receive the vibration signal and the audio signal, and change the gain level and/or tone of the audio signal based on the vibration signal to generate the filtered audio signal. The audio controller also may receive a speed signal, and change the gain level and/or tone of the audio signal based on the speed signal to generate the filtered audio signal.

38 Claims, 7 Drawing Sheets

U.S. PATENT DOCUMENTS

| | | | | |
|---|---|---|---|---|
| 5,907,622 | A * | 5/1999 | Dougherty | 381/57 |
| 6,549,836 | B1 | 4/2003 | Yeh et al. | 701/45 |
| 6,628,788 | B2 * | 9/2003 | Azizi | 381/57 |
| 7,092,536 | B1 * | 8/2006 | Hutt et al. | 381/96 |
| 7,180,892 | B1 * | 2/2007 | Tackin | 370/389 |
| 7,212,640 | B2 * | 5/2007 | Bizjak | 381/106 |
| 2002/0141601 | A1 * | 10/2002 | Finn et al. | 381/92 |
| 2003/0186784 | A1 * | 10/2003 | Ogawa | 482/8 |

FOREIGN PATENT DOCUMENTS

| | | |
|---|---|---|
| JP | 57-136811 | 8/1982 |
| JP | 58-063207 | 4/1983 |
| JP | 58179009 | 10/1983 |
| JP | 59-230313 | 12/1984 |
| JP | 60-145714 | 8/1985 |
| JP | 05-301542 | 11/1993 |
| JP | 06-083387 | 3/1994 |
| JP | 06-319192 | 11/1994 |
| JP | 08-116600 | 5/1996 |
| JP | 3094517 | 8/2000 |
| JP | 2002-19573 | 1/2002 |

OTHER PUBLICATIONS

"Automatic Sound Levelizer System", by Mr. M. Hirota, Toyota Motor Company; Mr. H. Kihara, Mr. S. Kato and Mr. A. Iwasaki, Pioneer Electronic Corporation, Japan [99AE004].

Japanese Patent Office Official Action issued in Japanese Patent Application No. 2004-324410, dated Mar. 24, 2009, with English translation, 15 pages.

Japanese Patent Office Official Action issued in Japanese Patent Application No. 2004-324410, dated Sep. 11, 2008, with English translation, 8 pages.

* cited by examiner

AUTOMOTIVE AUDIO CONTROLLER WITH VIBRATION SENSOR

BACKGROUND OF THE INVENTION

1. Technical Field

This invention relates to a sound system for an automobile, and more particularly, to a sound system capable of dynamically adjusting gain and tone characteristics for a reproduced audio signal in accordance with a vibration level in the automobile.

2. Related Art

Human perception of acoustic signals, such as an audio signal (music, speech, etc.) generated by an audio reproduction system, is affected by the presence of ambient noise. Therefore, audio reproduction systems designed to operate in noisy environments, such as inside an automobile, often contain components that attempt to compensate for perceived degradation of the audio signal caused by noise.

Ambient noise in automobiles, caused by, for example, the engine or the interaction of the tires and the road surface, may not be band-limited but usually has strong components below approximately 200 Hz. This low frequency ambient noise causes problems for automotive audio reproduction systems. First, the volume of the signal as perceived by a listener, commonly referred to as the "apparent volume," is a function of the noise, and hence, the apparent volume decreases as the noise increases. Listeners may wish to maintain the apparent volume at a constant level, but this is difficult as the ambient noise changes dynamically in an automobile, for example, because of changing road conditions and/or changing automobile speeds. This problem often is referred to as the "apparent volume problem."

One method of compensating for the apparent volume problem, referred to as the "noise-only-method," involves increasing the gain of the signal as a function of the ambient noise. This method prevents soft passages from being overwhelmed by the noise. However, the method may be disadvantageous because it varies the gain irrespective of the volume level set by the user, so the method increases the gain in response to increasing noise even for very high volume levels. These increases may result in producing signals that are painfully loud for a listener, harmful to the audio reproduction equipment, or both.

In an automobile, the ambient noise is concentrated in the low frequency range, so signals are masked more in lower frequency ranges than in higher frequency ranges. This causes the signals to lose their desired tone. This problem often is referred to as the "uneven masking problem."

In general, systems designed to compensate for either the apparent volume problem or the uneven masking problem include some way of estimating the level of the ambient noise. Some automotive audio reproduction systems use a microphone located inside the passenger compartment of the automobile to measure ambient noise. The use of a microphone in the passenger compartment, however, may have several disadvantages. Since the microphone is generally sensitive to all sounds in the automobile, including the signals generated by the audio reproduction system, it may be necessary to filter the signal generated by the microphone to yield a signal representative of the noise.

One method for filtering the microphone output signal involves use a low pass filter to remove higher frequencies where the reproduced audio signal may be concentrated. This method, however, may generate a signal that represents only the sub-audio low-frequency noise, rather than the actual masking noise that may contain higher frequencies. Another method of filtering the microphone signal is to subtract the reproduced audio signal from the microphone signal to obtain a signal representative of the noise. This method may be disadvantageous because it involves the transfer function from the speakers of the audio reproduction system to the microphone. The transfer function may be difficult to determine, and, moreover, may vary dynamically, for example, with changes in the number of passengers in the automobile. Furthermore, using a microphone in the passenger compartment of the automobile may cause increases in the signal in response to speech of passengers, so that the audio reproduction system may attempt to "drown out" conversations.

Other methods implementing complex systems of sensors and digital signal processors also have been used to compensate for ambient noise in an automobile. Many of these complex systems are not economically feasible for use in mass produced automobiles. None of these prior systems provides both an economically viable and satisfactory sounding solution. Hence, it would be desirable to provide a satisfactory sounding and economical automobile sound system that compensates for ambient noise in the automobile.

SUMMARY

An automotive audio controller is provided for receiving an audio signal from an audio source and providing a filtered audio signal that compensates for ambient noise in the automobile. The audio controller may have a vibration sensor that generates a vibration signal indicative of vibrations in the automobile. A dynamic filter of the audio controller may receive the vibration signal and the audio signal, and change the gain level and/or tone of the audio signal based on the vibration signal to generate the filtered audio signal. For example, the dynamic filter may increase the gain level of the audio signal as the vibration signal increases to generate the filtered audio signal.

The audio controller also may receive a speed signal and change the gain level and/or tone of the audio signal based on the speed signal to generate the filtered audio signal. For example, the dynamic filter may increase the gain level of the audio signal as the speed signal increases to generate the filtered audio signal. The audio controller also may receive a volume control signal. The volume control signal may affect how the dynamic filter changes the audio signal as a function of the vibration and/or speed signals. For example, when the volume control signal is low, the dynamic filter may increase the gain level of the audio signal by a first factor as the speed signal and/or the vibration signal increases in order to generate the filtered audio signal. When the volume control signal is high, however, the dynamic filter may increase the gain level of the audio signal by a second factor, or not at all, as the speed signal and/or the vibration signal increases in order to generate the filtered audio signal.

Other systems, methods, features and advantages of the invention will be, or will become, apparent to one with skill in the art upon examination of the following figures and detailed description. It is intended that all such additional systems, methods, features and advantages be included within this description, be within the scope of the invention, and be protected by the following claims.

BRIEF DESCRIPTION OF THE DRAWINGS

The invention can be better understood with reference to the following figures. The components in the figures are not necessarily to scale; emphasis is instead being placed upon illustrating the principles of the invention. Moreover, in the figures, like reference numerals designate corresponding parts throughout the different views.

DETAILED DESCRIPTION OF THE PREFERRED EMBODIMENTS

First Automotive Audio Controller

Figure 1:
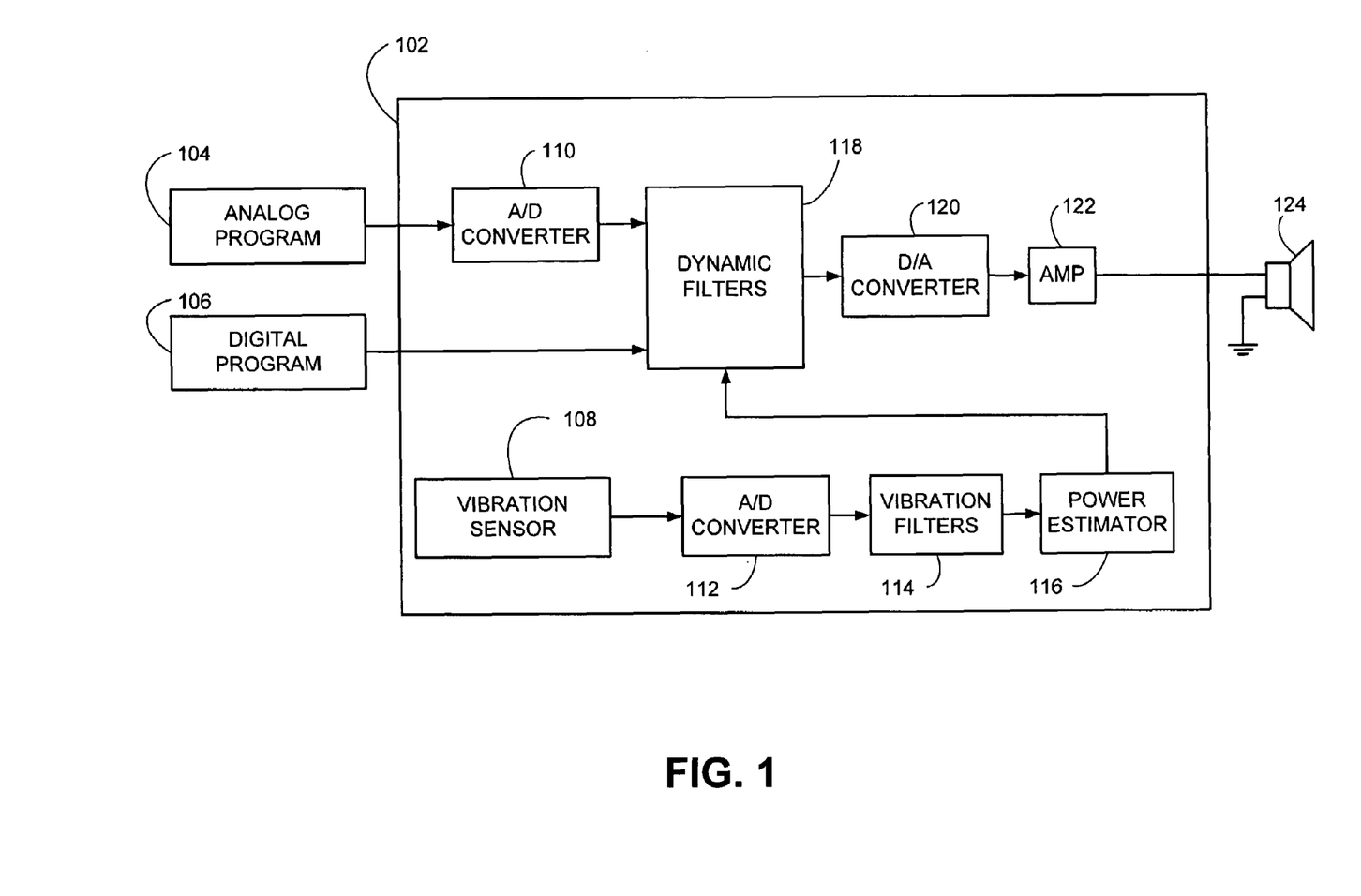
FIG. 1 is a block diagram for an example automotive audio controller.

A first example automotive audio controller 102 for use in an automobile is shown in FIG. 1. The term "automotive audio controllers" as used herein refers to items known in the vernacular as "car stereos" or "car stereo components." Automotive audio controllers are frequently installed in most types of motorized vehicles. The term "automobile" as used herein refers to motorized vehicles, such as motorcycles, boats, fixed or rotary wing aircraft, or any other vehicles that have an engine and transport passengers. The term "passenger compartment" is used herein to refer to a space in or on a vehicle that is occupied by passengers, such as the cabin of a car or an aircraft, or the space generally between the handlebars and the taillight of a motorcycle.

The automotive audio controller 102 may be coupled to an analog audio source 104, a digital audio source 106, and at least one speaker 124. The automotive audio controller 102 may be configured to accept an analog audio signal from the analog audio source 104 and a digital audio signal from the digital audio source 106. The automotive audio controller 102 may generate a driving electrical signal to drive the speaker 124. The automotive audio controller 102 may include a vibration sensor 108 that generates a vibration level signal indicative of vibration. The driving electrical signal may be based on the analog and/or digital audio signals and the vibration level signal. The automotive audio controller 102 may "compensate" the driving electrical signal for ambient noise in the automobile passenger compartment by, for example, raising the level and/or changing the tone of the driving electrical signal in response to increases in the ambient noise level.

The analog and/or digital audio signals may be multi-channel signals, such as stereo or surround sound signals. The automotive audio controller 102 may include an amplifier 122 that is coupled to the speaker 124. The amplifier 122 may comprise a stereo or multi-channel amplifier, such as a five or seven channel surround sound amplifier with or without a subwoofer amplifier. Likewise, the speaker 124 may include a plurality of speakers coupled to the channels of the amplifier 122 to reproduce the stereo or multi-channel audio.

The vibration sensor 108 may include any type of vibration sensor capable of sensing vibrations and generating an analog or digital signal indicating the frequency and amplitude of sensed vibrations. For example, the vibration sensor 108 may include a mass loaded cantilever vibration sensor. One such vibration sensor is the Minisense 100-HT vibration sensor produced by Measurement Specialties, Inc. of Wayne, Pa. The vibration sensor 108 may be mounted to the automobile such that vibrations caused by interaction between the tires and the road or by wind moving across the automobile, as well as vibrations caused by the engine or other moving parts, excite (vibrate) the vibration sensor 108. For example, the vibration sensor 108 may be mounted in the dash, under a seat, between the roof and the headliner, in one of the doors, in the trunk, to the frame, or the like.

The analog audio source 104 may include a terrestrial or satellite radio receiver, a cassette tape player, a compact disc player ("CD player"), a minidisk player ("MD player"), an eight-track tape player, a digital audio tape player ("DAT player"), a digital versatile disc player ("DVD player"), an MPEG layer 3 audio player ("MP3 player") or other devices that produce an analog audio signal.

The digital audio source 106 may include a CD player, an MD player, DAT player, a DVD player, an MP3 player, a digital radio receiver, or a similar device that is capable of generating a digital audio output. For example, the digital audio source 106 may provide, via an optical Toshiba® Link ("TOSLINK®") and/or an electrical Sony®/Phillips® digital interface ("S/PDIF"), a pulse-code modulated ("PCM"), a digital theater systems ("DTS®"), or a Dolby® Digital signal. The digital audio source 106 also may provide a digital audio signal through a wide area or local area network, such as such as a MOST® network, a COBRANet® network, an Ethernet® network, a universal serial bus ("USB®") network, and/or other types of wired or wireless networks.

The automotive audio controller 102 may include first and second analog-to-digital converters ("A/D converters") 110 and 112, dynamic filters 118, vibration filters 114, a power estimator 116, a digital-to-analog converter ("D/A converter") 120, and an amplifier 122. The A/D converters 110 and 112 may each be a device that translates a continuously varying (analog) signal, such as a voltage or a current, to a succession of discrete digital values. Each A/D converter 110 and 112 may sample an analog signal periodically and produce a digital value representing the amplitude of the analog signal for each sample.

For example, the first A/D converter 110 may be coupled to the analog audio source 104 and may sample the analog audio signal at around 44.1 kHz or above and produce an 8-bit to 24-bit number representing the amplitude of the analog audio signal for each sample. The second A/D converter 112 may be coupled to the vibration sensor 108 and may sample the analog vibration signal at, for example, 1 kHz or above and produce a 4-bit to 24-bit number representing the amplitude of the vibration signal for each sample. The D/A converter 120 may be a device that translates digital data to an analog signal, such as a line-level signal. The D/A converter 120 may be coupled to and receive a succession of discrete digital values from the dynamic filters 118 as an input. The D/A converter 120 also may be coupled to the amplifier 122, and may create an analog signal as an output thereto, the amplitude of which corresponds to each digital value in time.

The dynamic filters 118 may be a digital signal processor ("DSP") capable of receiving a plurality of digital audio signals and one or more control signals, and altering and/or switching between the digital audio signals either as a function of the control signals, or in a predetermined fashion. The term "filters" is used here and elsewhere rather than terms such as "filter(s)" or "filtering means" to describe one or more filters, and should not be read to limit the claimed invention in any way. The dynamic filters 118 may be coupled to and receive digital audio signals from the first A/D converter 110 and the digital audio source 106. The dynamic filters 118 also may be coupled to and receive a control signal from the power estimator 116.

The amplifier 122 may be an audio amplifier capable of receiving an analog audio signal, such as a line-level signal, and amplifying it to a level sufficient to a loudspeaker. For example, the amplifier 122 may be an automotive stereo or surround sound amplifier. The amplifier 122 may be coupled to and receive an analog audio signal from the D/A converter 120. The amplifier 122 may be coupled to and provide a driving electrical signal to the speaker 124.

The vibration filters 114 may be a DSP capable of receiving a digital vibration signals and altering the digital vibration signals in a predetermined fashion. The vibration filters 114 may be coupled to the second A/D converter 112. The power estimator 116 may be a DSP or a controller capable of generating a normalized power value indicative of the relative level of vibration sensed by the vibration sensor. For example, the power estimator may be tuned to a particular model of automobile, and may generate a normalized vibration power value between 0 and 100. The power estimator 116 may be coupled between the vibration filters 114 and the dynamic filters 118.

In FIG. 1, the analog source 104 may transmit an analog audio signal to the first A/D converter 110. The first A/D converter 110 may convert the analog audio signal to a first digital audio signal, and transmit the first digital audio signal to the dynamic filters 118. The digital source 106 may transmit a second digital audio signal directly to the dynamic filters 118. The analog and digital audio signals may each be a monophonic, stereophonic, or multi-channel audio signal.

The dynamic filters 118 may receive the digital audio signals from the digital source 106 and/or the first A/D converter 110. One of these digital audio signal may be selected, for example by a selection control signal (not shown), altered (filtered), and transmitted by the dynamic filters 118 to the D/A converter 120. The D/A converter 120 may convert the filtered digital audio signal to a filtered analog audio signal. The filtered analog audio signal may be sent by the D/A converter 120 to the amplifier 122. The amplifier 122 may amplify the filtered analog audio signal to drive the speaker 124.

Figure 2:
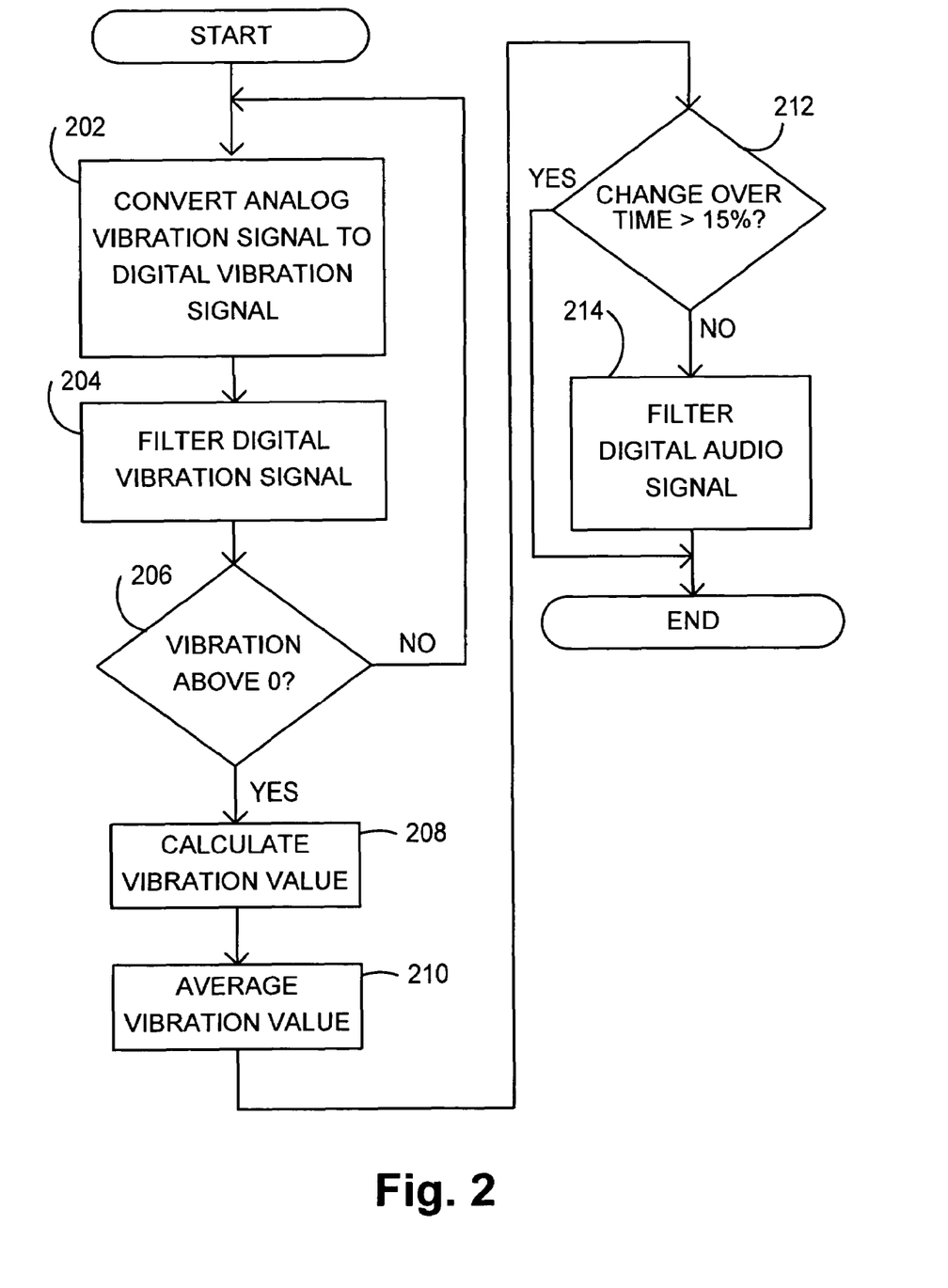
FIG. 2 is an example flow chart for the example automotive audio controller of FIG. 1.

FIG. 2 is an example flow chart for the first automotive audio controller 102. At 202, the second A/D converter 112 may convert an analog vibration signal from the vibration sensor 108 into a digital vibration signal. At 204, the vibration filters 114 may receive a digital vibration signal from the second A/D converter 112. The vibration filters 114 may implement a combination of bass-shelf (low pass), treble-shelf (high pass), Peak and/or Notch filters. Particular filters implemented in the vibration filters 114 may be customized for different automobile models.

Figure 3:
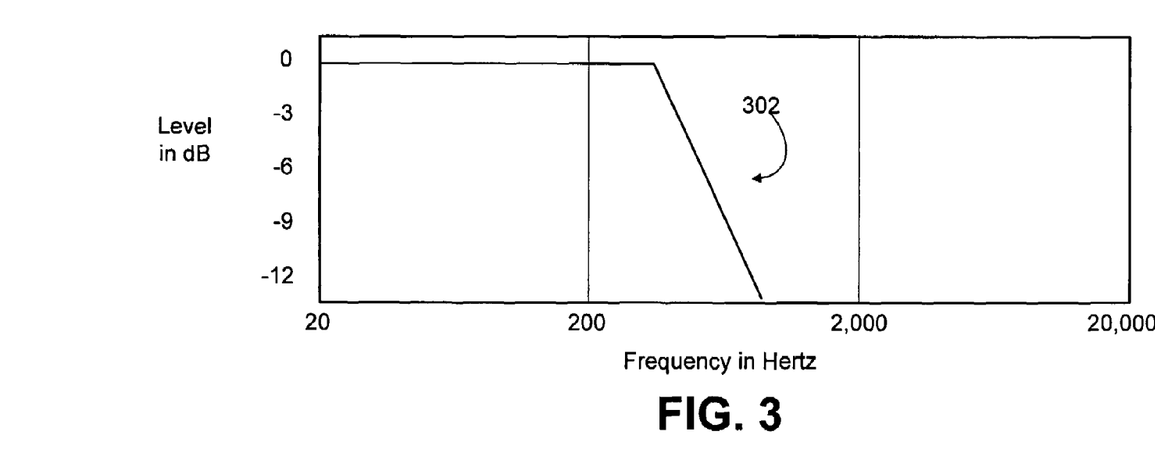
FIG. 3 is a frequency response graph for an example vibration filter of an automotive audio controller including a bass-shelf filter.

For example, in a certain automobile model ambient noise in the passenger compartment may be caused primarily by vibrations in the frequency range of 20 Hz to 500 Hz. Therefore, the vibration filters 114 may include a bass-shelf filter that has a cutoff frequency of 500 Hz. A frequency response plot for an example bass-shelf filter with a cutoff frequency 302 of 500 Hz is shown in FIG. 3.

Figure 4:
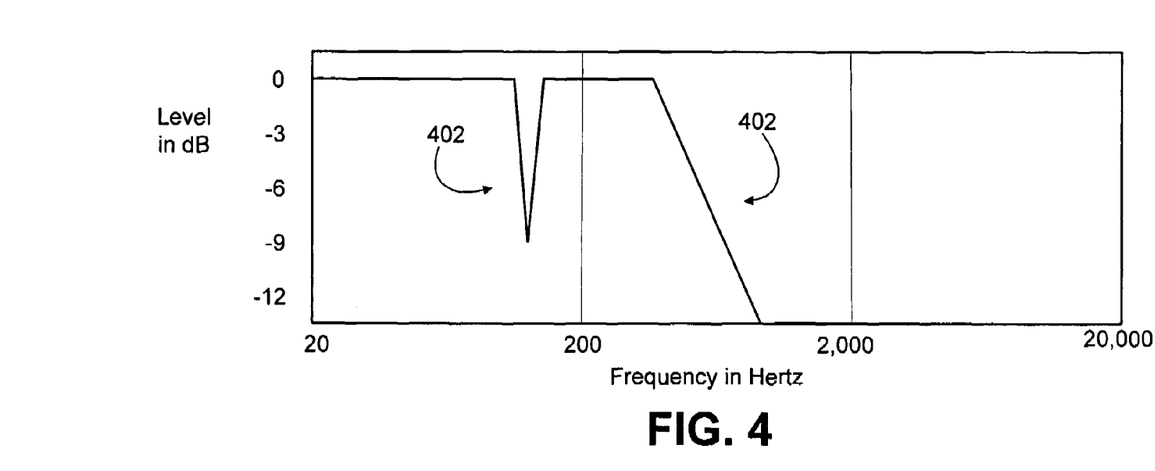
FIG. 4 is a frequency response graph for a second example vibration filter of an automotive audio controller including a notch filter with a bass-shelf filter.

For further example, the vibration sensor 108 may be near a vibration source inside the automobile, such as an air conditioner fan vibrating at a frequency of 100 Hz. To prevent such a vibration source from distorting the vibration signal, the vibration filters 114 may include a notch filter centered at 100 Hz, in addition to a bass-shelf filter that has a cutoff frequency of 500 Hz. A frequency response plot for an example notch filter with a center frequency 402 of 500 Hz combined with a bass-shelf filter that has a cutoff frequency 404 of 500 Hz is shown in FIG. 4.

The vibration filters 114 also may include high-pass and low-pass filters of various orders. For example, the vibration filters 114 may include a low-pass filter with a cutoff frequency of about 20 kHz to filter out vibrations above the audible range, and a high-pass filter with a cutoff frequency of about 2 Hz to filter out direct current (DC) signals.

The vibration filters 114 may transmit a filtered vibration signal to the power estimator 116. The power estimator 116 also may be customized for different automobile models. For example, the power estimator 116 may generate a normalized vibration level value indicative of a relative level of vibration sensed by the vibration sensor, such that the normalized vibration level value is consistent from one automobile model to another. A first model of automobile may have a maximum filtered vibration signal level of 200, and a second model of automobile may have a maximum filtered vibration signal level of 50. The power estimator 116 may normalize the filtered vibration signal levels in the first automobile model by dividing by two, and normalize the filtered vibration signal levels in the second automobile model by multiplying by two. Such normalizing may allow the dynamic filters 118 to be designed for operation in a wider range of automobile models.

At 208, the power estimator 116 may square and/or integrate and/or determine a root of the received filtered vibration signal to determine the normalized vibration level value. Where each of these three operations is carried out, the normalized vibration level value may be a function of the root-mean-square (RMS) power level of the filtered vibration signal.

At 210, the power estimator 116 may integrate (average) the received filtered vibration signal over time in order to smooth level transitions in the filtered signal. For example, the filtered vibration signal may be averaged over a period of ten seconds. The averaging may lessen sudden, unnatural, adjustments to the filtered signal. When the automobile hits a bump, there may be an extreme, but short duration, increase in vibration level. For a large bump, a corresponding increase (without averaging) to the filtered signal could startle passengers, or have other negative consequences.

In addition to averaging the filtered vibration signal over time, at 212 the power estimator 116 also may bound the normalized vibration level value over time. For example, the power estimator 116 may limit (bound) the normalized vibration level value to plus or minus around 15% of an averaged normalized vibration level value over a period of time, such as five seconds. Such bounding may help to reduce sudden, unnatural, adjustments to the filtered signal.

At 214, the dynamic filters 118 may receive the normalized vibration level value from the power estimator 116 in addition to the audio signals. The dynamic filters 118 may include high-pass, band-pass, and/or low-pass filters of various orders to adjust the tone of the filtered digital audio signal, and also may be capable of adjusting the overall level of the filtered digital audio signal. To compensate for changes to the "apparent volume" level of the filtered digital audio signal, the dynamic filters 118 may increase the level of the filtered digital audio signal as a function of the normalized vibration level value. For example, the level of the filtered digital audio signal may be increased proportionally to the normalized vibration level value.

To compensate for "uneven masking" of the filtered digital audio signal by ambient noise, the dynamic filters 118 may increase the level of certain frequency ranges of the filtered digital audio signal as a function of the normalized vibration level value. For example, the "bass" (low frequency range) level of the filtered digital audio signal may be increased more than other frequency ranges.

Different automobile models may produce different ambient noise for the same vibration level. To compensate for these differences, the automotive audio controller 102 may be configured differently for different models. For example, ambient noise and vibration characteristics may be measured for an automobile model on test tracks to determine ambient noise characteristics as a function of vibration. These measured characteristics may be used to configure the vibration filters 114, the power estimator 116, and the dynamic filters 118 for the automobile model.

Second Automotive Audio Controller

Figure 5:
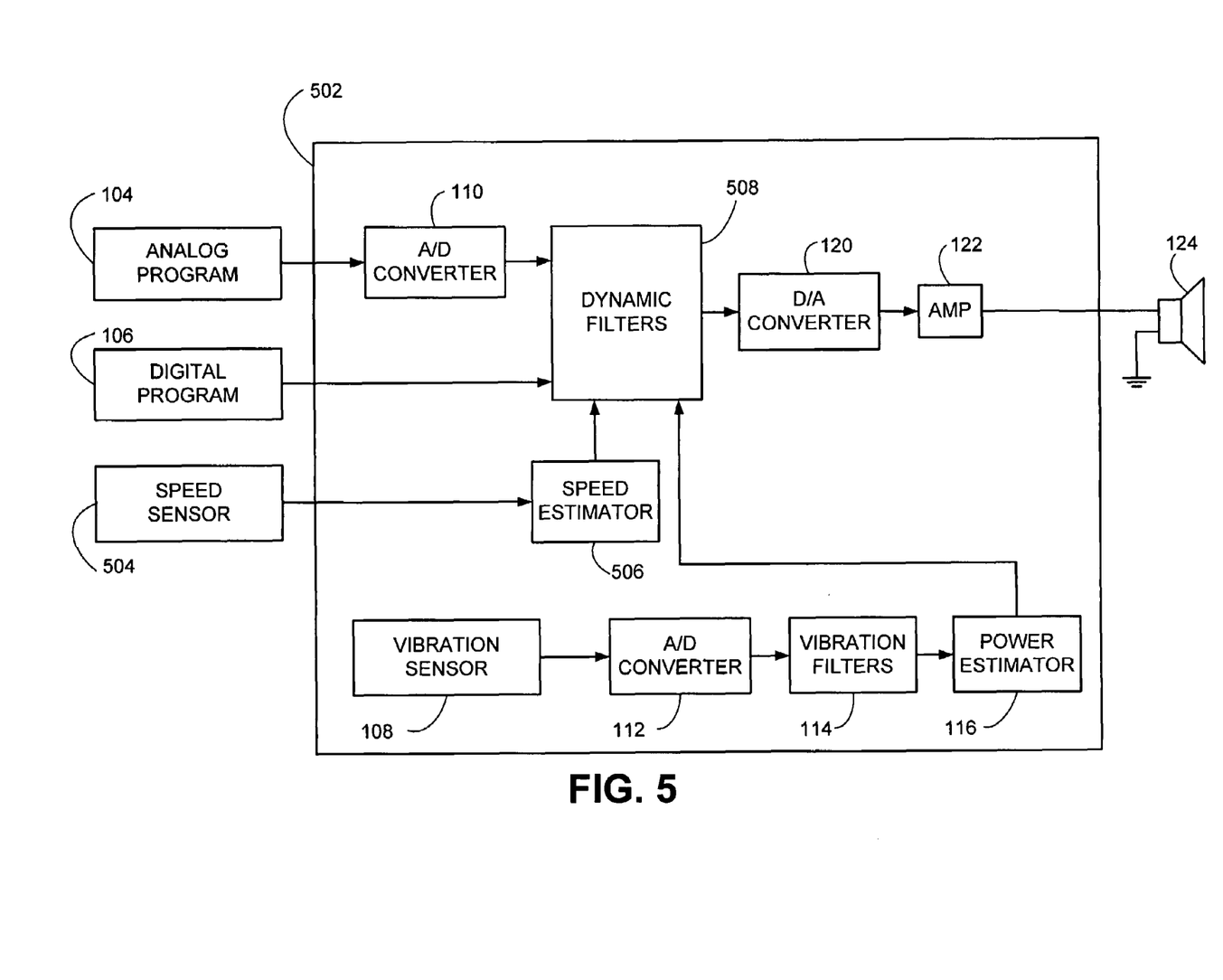
FIG. 5 is a block diagram for a second example automotive audio controller including a speed sensor and a speed estimator.

A second example automotive audio controller 502 is shown in FIG. 5 including a speed sensor 504 and a speed estimator 506. The automotive audio controller 502 may be configured to accept analog and/or digital audio signals and include the vibration sensor 108 to generate a vibration level signal, in the same manner as the first automotive audio controller 102 described above. The second automotive audio controller 502 also may be coupled to and receive a speed signal from a speed sensor 504. The speed sensor 504 may be, for example, a speedometer having a digital output. The speed sensor may transmit the speed signal directly to the automotive audio controller 502, or may transmit the speed signal through an automotive interface bus. The automotive audio controller 502 may generate a driving electrical signal to drive the speaker 124 in the same manner as the automotive audio controller 102.

Figure 6:
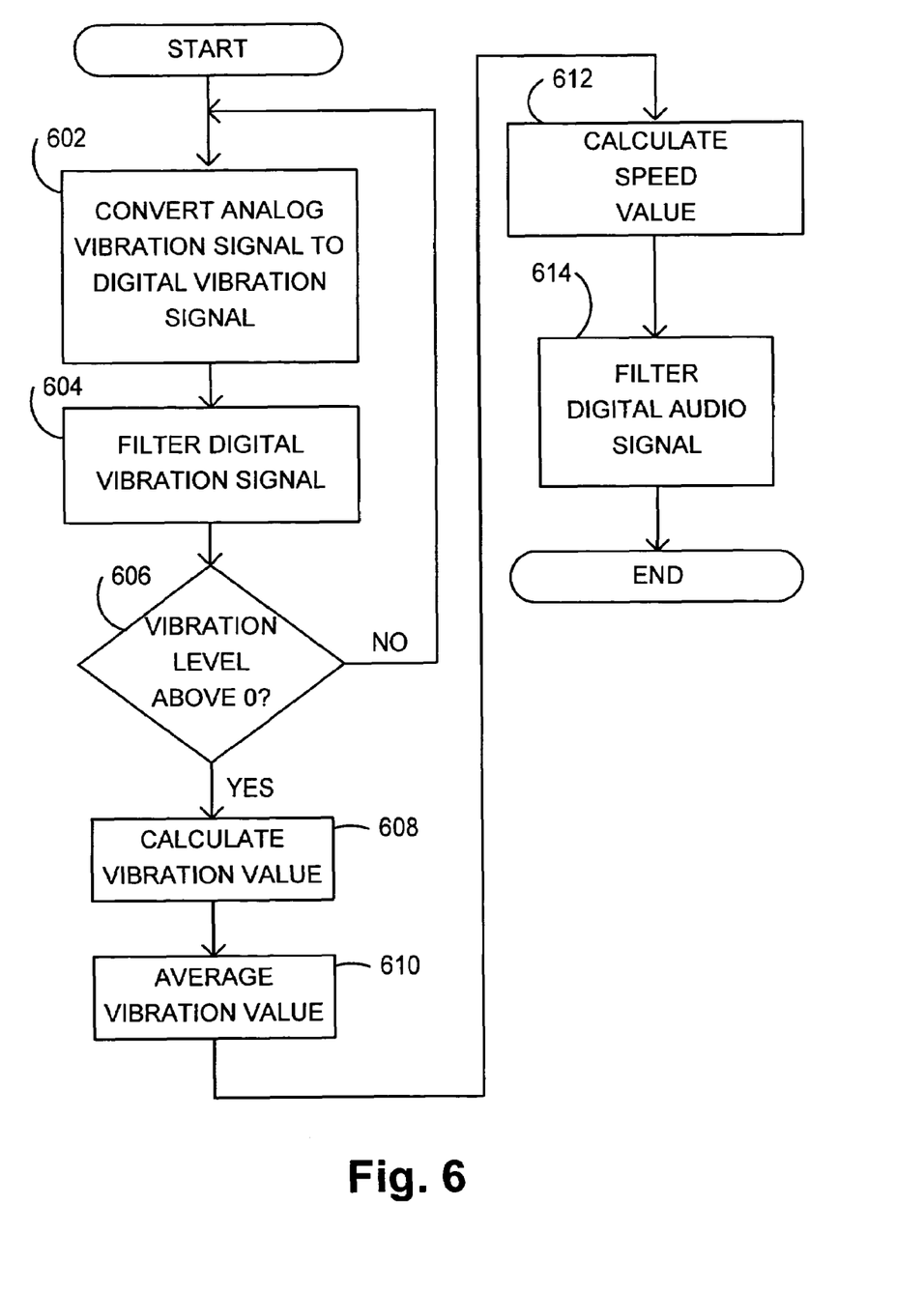
FIG. 6 is an example flow chart for the second example automotive audio controller of FIG. 5.

The automotive audio controller 502 may include the A/D converters 110 and 112, the vibration filters 114, the power estimator 116, the D/A converter 120, the amplifier 122, a speed estimator 506, and dynamic filters 508. Except for the speed sensor 506, the components of the second example automotive audio controller 502 may be configured in the same manner as the components in the first example automotive controller 102. FIG. 6 is an example flow chart for the second automotive audio controller 502. At 602-610, the second automotive audio controller 502 may operate in the same fashion as the first automotive audio controller 102.

The speed estimator 506 may be coupled between the speed sensor 504 and the dynamic filters 508. At 612, the speed estimator 506 may receive the speed signal from the speed sensor 504 and convert the speed signal into a speed value, such as a numerical indicator of speed in kilometers per hour or miles per hour. The speed estimator 506 may transmit the speed value to the dynamic filters 508.

The dynamic filters 508 may be a DSP capable of receiving a plurality of digital audio signals and one or more control signals, and altering and/or switching between the digital audio signals either as a function of the control signals, or in a predetermined fashion. The dynamic filters 508 may receive the normalized vibration level value from the power estimator 116 and the speed value from the speed estimator 506 in addition to the audio signals. The dynamic filters 508 may include high-pass, band-pass, and/or low-pass filters of various orders to adjust the tone and/or the level of the filtered digital audio signal.

At 614, to compensate for changes to the "apparent volume" level of the filtered digital audio signal, the dynamic filters 508 may increase the level of the filtered digital audio signal as a function of the normalized vibration level value, as a function of the speed value, or as a function of both. For example, the level of the filtered digital audio signal may be increased proportionally to the normalized vibration level value, proportionally to the speed value, or proportionally to both the normalized vibration level value and the speed value.

Also at 614, to compensate for "uneven masking" of the filtered digital audio signal by ambient noise, the dynamic filters 508 may increase the level of certain frequency ranges of the filtered digital audio signal as a function of the normalized vibration level value, as a function of the speed value, or as a function of both. For example, the "bass" (low frequency range) level of the filtered digital audio signal may be increased more than other frequency ranges when the normalized vibration level value increases, and the "treble" (high frequency range) level of the filtered digital audio signal may be increased more than other frequency ranges when the speed value increases. Such a configuration may be desirable where a high speed value indicates an increase in wind noise, which may be concentrated in higher frequencies for a certain automobile model.

Third Automotive Audio Controller

Figure 7:
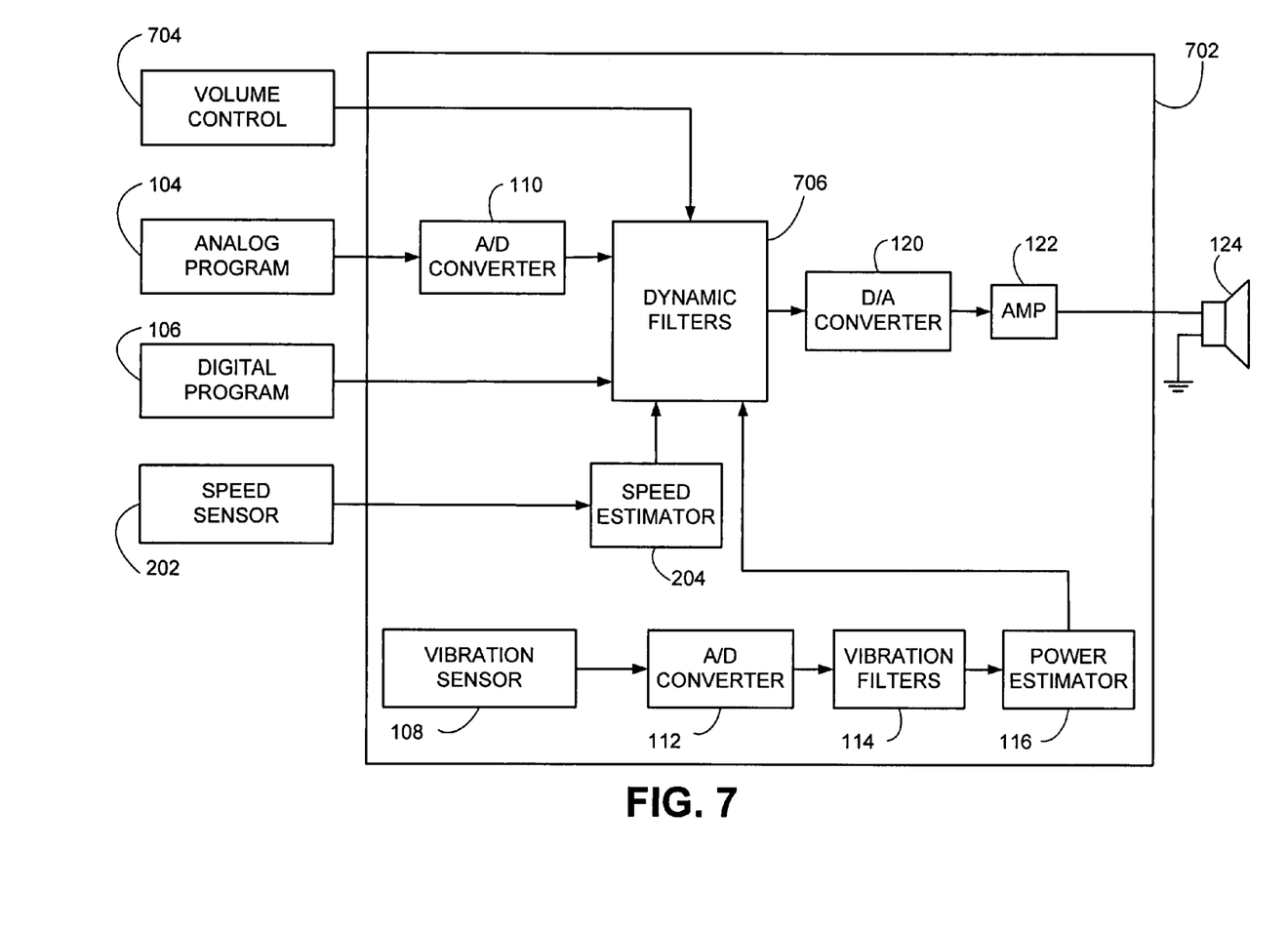
FIG. 7 is a block diagram for a third example automotive audio controller including volume control.

A third example automotive audio controller 702 is shown in FIG. 7. The automotive audio controller 702 may be configured to accept analog and/or digital audio signals and a speed signal, and include the vibration sensor 108 to generate a vibration level signal, in the same manner as the first and second automotive audio controllers 102 and 502.

The third automotive audio controller 702 may include the A/D converters 110 and 112, the vibration filters 114, the power estimator 116, the D/A converter 120, the amplifier 122, the speed estimator 506, and dynamic filters 706. The dynamic filters 706 may be a DSP capable of receiving a plurality of digital audio signals and one or more control signals, and altering and/or switching between the digital audio signals either as a function of the control signals, or in a predetermined fashion. The components of the third example automotive audio controller 702 may be configured in the same manner as the components in the second example automotive controller 502.

The third automotive audio controller 702 may, however, also be coupled to a volume control 704. The third automotive audio controller 702 may receive a volume control signal from the volume control 704. The volume control 704 may be, for example, a manually actuated potentiometer with an A/D converter to generate a volume control signal, a jog/shuttle control generating pulses, or the like.

Figure 8:
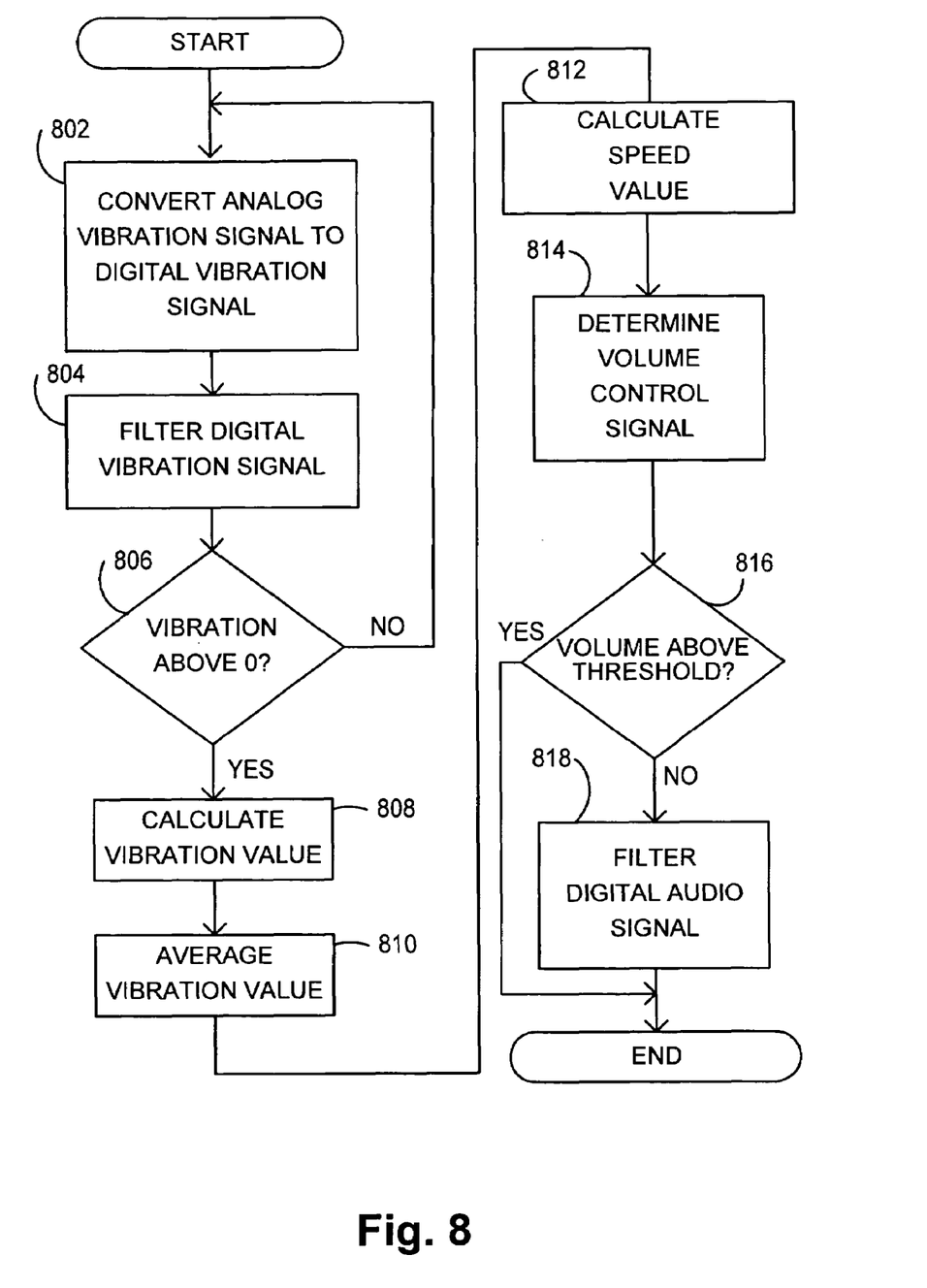
FIG. 8 is an example flow chart for the third example automotive audio controller of FIG. 7.

FIG. 8 is an example flow chart for the second automotive audio controller 702. At 802-812, the third automotive audio controller 702 may operate in the same fashion as the second automotive audio controller 502. At 814, the volume control 704 may transmit the volume control signal directly to the third automotive audio controller 702, or may transmit the volume control signal through an automotive interface bus. The third automotive audio controller 702 may generate a driving electrical signal to drive the speaker 124 in the same manner as the automotive audio controller 502.

The dynamic filters 706 may receive the normalized vibration level value from the power estimator 116, the speed signal from the speed estimator 506, and the volume control signal from the volume control 704 in addition to the audio signals. The dynamic filters 706 may include high-pass, band-pass, and/or low-pass filters of various orders to adjust the tone of the filtered digital audio signal, and also may adjust the level of the filtered digital audio signal. To compensate for changes to the "apparent volume" level of the filtered digital audio signal, the dynamic filters 706 may increase the level of the filtered digital audio signal as a function of the volume control signal, and also as a function of the normalized vibration level value and/or the speed value.

For example, the level of the filtered digital audio signal may be increased proportionally to a level of the volume control signal. At 816, when the level of the volume control signal is low (i.e., below a first threshold), at 818 the level of the filtered digital audio signal may be increased at a first rate based on the normalized vibration level value, at a first rate based on the speed value, or at a first rate based on both the normalized vibration level value and the speed value. At 816, when the level of the volume control signal is "medium" (i.e., above the first threshold but below a second threshold), at 818 the level of the filtered digital audio signal may be increased at a second rate based on the normalized vibration level value and/or the speed value, because the "apparent volume" level may not decrease by the same amount when the level of the filtered digital audio signal is already raised. At 818, when the volume control signal is "high" (i.e., above the second threshold), the level of the filtered digital audio signal may stay constant irrespective of the normalized vibration level value and/or the speed value, because there may be no significant change in the "apparent volume" level due to ambient noise.

Similarly, to compensate for "uneven masking" of the filtered digital audio signal by ambient noise, at 818 the dynamic filters 706 may increase the level of certain frequency ranges of the filtered digital audio signal to a greater or lesser degree depending on the volume control signal. For example, at 816 when the volume control signal is high, at 818 the dynamic filters 706 may increase the treble less than the bass in response to increased normalized vibration level and/or speed values.

The first, second, and third automotive audio controllers 102, 502, and 702 may be constructed so that the vibration sensor 108 is in a housing with the amplifier 122. In this configuration, heat generated by the amplifier 122 may distort the vibration signal. Therefore, the audio controllers 102, 502, and 702 may each include a temperature sensor (not shown) near the vibration sensor 108. The temperature sensor may produce a temperature value that can be used by the vibration filters 114 and/or the power estimator 116 to compensate for heat-induced variations in the normalized vibration level value.

Because the automotive audio controllers 102, 502, and 702 do not directly measure ambient noise in an automobile passenger compartment (for example, with a microphone), the vibration sensor 108 as well as the automotive audio controllers 102, 502, and 702 may be located in an automobiles trunk, or in another area "isolated" from the passenger compartment. Furthermore, because the automotive audio controllers 102, 502, and 702 do not directly measure ambient noise, there is a reduced possibility of "feedback" from audio reproduced by the speaker 124, or of passenger conversations being detected as noise.

While various embodiments of the invention have been described, it will be apparent to those of ordinary skill in the art that many more embodiments and implementations are possible that are within the scope of the invention. Accordingly, the invention is not to be restricted except in light of the attached claims and their equivalents.

The invention claimed is:

1. An automotive audio controller for receiving an audio signal from an audio source and providing a filtered audio signal, the audio controller comprising:
   a non-sonic excitement sensor attached to a surface on or within an automobile, the non-sonic excitement sensor configured to detect a non-sonically induced excitement level of the surface;
   a power estimator coupled to the non-sonic excitement sensor, where the power estimator is configured to receive the detected non-sonically induced excitement level, the power estimator further configured to convert the detected non-sonically induced excitement level into a vibration power value that is indicative of the non-sonically induced excitement level detected by the non-sonic excitement sensor; and
   a dynamic filter coupled to the power estimator, where the dynamic filter is configured to receive the vibration power value, and the dynamic filter is further coupled to the audio source, where the dynamic filter is further configured to receive the audio signal; and
   where the dynamic filter is configured to generate a filtered audio signal based on the audio signal and the vibration power value, and the filtered audio signal is amplified to generate a driving electrical signal for a speaker.

2. The automotive audio controller of claim 1, further comprising an A/D converter coupled between the non-sonic excitement sensor and the power estimator, the A/D converter configured to convert the detected non-sonically induced excitement level to a digital vibration signal.

3. The automotive audio controller of claim 1, further comprising a vibration filter coupled between the non-sonic excitement sensor and the power estimator, where the vibration filter is configured to filter a frequency component of the detected non-sonically induced excitement level received by the power estimator.

4. The automotive audio controller of claim 3, where the vibration filter comprises a low-pass filter having a cutoff frequency of between about 100 Hz and about 1 kHz, and the low-pass filter that attenuates frequencies of the detected non-sonically induced excitement level above the cutoff frequency.

5. The automotive audio controller of claim 3, where the vibration filter comprises a low-pass filter having a cutoff frequency of between about 2 kHz and about 20 kHz, and the low-pass filter attenuates frequencies of the detected non-sonically induced excitement level above the cutoff frequency.

6. The automotive audio controller of claim 3, where the vibration filter comprises a high-pass filter having a cutoff frequency of between about 2 Hz and about 20 Hz, and the high-pass filter attenuates frequencies of the detected non-sonically induced excitement level vibration-signal below the cutoff frequency.

7. The automotive audio controller of claim 3, where the vibration filter comprises a notch filter.

8. The automotive audio controller of claim 1, where the vibration power value is normalized.

9. The automotive audio controller of claim 1, where the power estimator is configured to convert the detected non-sonically induced excitement level into the vibration power value by integrating the detected non-sonically induced excitement level over time.

10. The automotive audio controller of claim 1, where the power estimator converts the detected non-sonically induced excitement level into the vibration power value by integrating a square of the detected non-sonically induced excitement level over time.

11. The automotive audio controller of claim 1, where the power estimator is configured to convert the detected non-sonically induced excitement level into the vibration power value, and where the power estimator is further configured to limit changes to the vibration power value over time.

12. The automotive audio controller of claim 1, where the dynamic filter is further configured to generate the filtered audio signal by increasing a gain value of the audio signal based on the vibration power value.

13. The automotive audio controller of claim 1, where the dynamic filter is further configured to generate the filtered audio signal by increasing a gain value of the audio signal as the vibration power level increases.

14. The automotive audio controller of claim 1, where the surface is located outside a passenger compartment of the automobile.

15. The automotive audio controller of claim 1, where an ambient noise level in a passenger compartment is estimated based on the non-sonically induced excitement level of the surface.

16. The automotive audio controller of claim 1, where the dynamic filter is further configured to compensate the audio signal for uneven masking in at least one range of frequencies contained in the audio signal.

17. The automotive audio controller of claim 1, where the non-sonic excitement sensor is configured to detect the non-sonically induced excitement level of the surface without substantial detection of a sonic output of the speaker.

18. An automotive audio controller comprising:
   a non-sonic vibration sensor configured to be in communication with an automobile, and the non-sonic vibration sensor further configured to measure a non-sonic vibration level of the automobile to generate a measured non-sonic vibration level signal;
   a speed sensor input configured to receive a speed signal indicative of a speed of the automobile;
   a power estimator in communication with the non-sonic vibration sensor, the power estimator configured to generate a power vibration level signal based upon the measured non-sonic vibration level signal; and
   a dynamic filter in communication with the power estimator and the speed sensor input, the dynamic filter configured to receive the power vibration level signal and the speed signal, where the dynamic filter is further configured to couple to an audio source to receive an audio signal, and where the dynamic filter is configured to generate a filtered audio signal based on the audio signal, the power vibration level signal, and the speed signal, and the filtered audio signal is amplified to generate a driving electrical signal for a speaker.

19. The automotive audio controller of claim 18, further comprising an A/D converter coupled between the speed sensor and the dynamic filter.

20. The automotive audio controller of claim 18, where the dynamic filter is configured to generate the filtered audio signal by increasing a gain value of the audio signal based on the power vibration level signal.

21. The automotive audio controller of claim 20, where the dynamic filter is configured to generate the filtered audio signal by increasing a gain value of the audio signal as a function of the speed signal.

22. The automotive audio controller of claim 18, where the dynamic filter is configured to generate the filtered audio signal by increasing a gain value of the audio signal as the power vibration level signal increases.

23. The automotive audio controller of claim 22, where the dynamic filter is configured to generate the filtered audio signal by increasing the gain of the audio signal as a level of the speed signal increases.

24. The automotive audio controller of claim 18, further comprising a vibration filter coupled between the non-sonic vibration sensor and the dynamic filter, where the vibration filter alters the measured non-sonic vibration level signal.

25. The automotive audio controller of claim 24, where the vibration filter comprises a low-pass filter having a cutoff frequency of between about 100 Hz and about 1 kHz, and the low-pass filter that attenuates frequencies of the measured non-sonic vibration level signal below the cutoff frequency.

26. The automotive audio controller of claim 18, where a location of the non-sonic vibration sensor is one of located in a dashboard of the automobile, located under a seat of the automobile, located between a roof and a headliner of the automobile, located in a door of the automobile, located in a trunk of the auto mobile, located on the frame of the automobile, located outside a passenger compartment of the automobile, or a combination thereof.

27. The automotive audio controller of claim 18, where the non-sonic vibration sensor is further configured to detect non-sonic vibration of the automobile related to an ambient noise level in a passenger compartment of the automobile.

28. The automotive audio controller of claim 18, where to generate the power vibration level signal, the power estimator is further configured to average the measured non-sonic vibration level signal to substantially eliminate short duration changes in measured non-sonic vibration level signal.

29. The automotive audio controller of claim 28, where to generate the power vibration level signal, the power estimator is further configured to limit changes in the measured non-sonic vibration level signal to a predetermined amount within a predetermined period of time.

30. The automotive controller of claim 18, where to generate the power vibration level, the power estimator is further configured to limit changes in the measured non-sonic vibration level signal to a predetermined amount within a predetermined period of time.

31. An automotive audio controller comprising:
   a vibration sensor configured to be in communication with an automobile and further configured to measure a non-sonic vibration level of the automobile to generate a measured non-sonic vibration signal;
   an audio signal input configured to couple to an audio source to receive an audio signal;
   a power estimator coupled to the vibration sensor, where the power estimator is configured to receive the measured non-sonic vibration signal, the power estimator further configured to convert the measured non-sonic vibration signal into a vibration power signal;
   a dynamic filter coupled to the power estimator to receive the vibration power signal, where the dynamic filter is coupled to the audio signal input, the dynamic filter further configured to receive the audio signal, the dynamic filter further configured to receive a speed signal, and where the dynamic filter is further configured to receive a volume control signal; and
   where the dynamic filter is configured to generate a filtered audio signal based on the audio signal, the vibration power signal, the speed signal, and the volume control signal.

32. The automotive audio controller of claim 31, where the dynamic filter is configured to generate the filtered audio signal by increasing a gain value of the audio signal based on the vibration power signal.

33. The automotive audio controller of claim 31, where the dynamic filter is configured to generate the filtered audio signal by increasing a gain value of the audio signal based on the vibration power signal when a level of the volume control signal is below a threshold level, and to generate the filtered audio signal directly from the audio signal when the level of the volume control signal is above the threshold level.

34. The automotive audio controller of claim 31, where the dynamic filter is configured to generate the filtered audio signal by increasing a gain value of the audio signal by a first factor based on the vibration power signal when a level of the volume control signal is below a threshold level, and to generate the filtered audio signal by increasing the gain of the audio signal by a second factor based on the vibration power signal when the level of the volume control signal is above the threshold level.

35. The automotive audio controller of claim 31, where the dynamic filter is configured to generate the filtered audio signal by increasing a gain value of the audio signal as a function of the speed signal.

36. The automotive audio controller of claim 31, where the dynamic filter is configured to generate the filtered audio signal by increasing a gain value of the audio signal as a function of the speed signal when a level of the volume control signal is below a threshold level, and to generate the filtered audio signal directly from the audio signal when the level of the volume control signal is above the threshold level.

37. The automotive audio controller of claim 31, where the dynamic filter is configured to generate the filtered audio signal by increasing a gain value of the audio signal by a first factor as a function of the speed signal when a level of the volume control signal is below a threshold level, and to generate the filtered audio signal by increasing the gain of the audio signal by a second factor as a function of the speed signal when the level of the volume control signal is above the threshold level.

38. A method of compensating for ambient noise in an automobile sound system, the method comprising:
receiving an audio signal from an audio source;
detecting with a sensor a non-sonic vibration level of the automobile; and
generating a filtered audio signal as a function of the audio signal and the non-sonic vibration level; and
where generating the filtered audio signal as the function of the audio signal and non-sonic vibration level further comprises:
averaging the non-sonic vibration level to eliminate extreme short duration changes in detected vibration level;
limiting changes in the non-sonic vibration level to a predetermined amount within a predetermined period of time to reduce sudden changes in detected vibration level; and
generating the filtered audio signal based on the audio signal and the averaged and limited non-sonic vibration level.

* * * * *

UNITED STATES PATENT AND TRADEMARK OFFICE
CERTIFICATE OF CORRECTION

| | | |
|---|---|---|
| PATENT NO. | : 7,606,376 B2 | Page 1 of 1 |
| APPLICATION NO. | : 10/703826 | |
| DATED | : October 20, 2009 | |
| INVENTOR(S) | : Eid et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1437 days.

Signed and Sealed this

Twelfth Day of October, 2010

David J. Kappos
*Director of the United States Patent and Trademark Office*